US009429830B2

(12) United States Patent
Nojima

(10) Patent No.: US 9,429,830 B2
(45) Date of Patent: Aug. 30, 2016

(54) FLUORESCENT LIGHT EMITTING ELEMENT AND PROJECTOR

(71) Applicant: SEIKO EPSON CORPORATION, Tokyo (JP)

(72) Inventor: Shigeo Nojima, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/598,667

(22) Filed: Jan. 16, 2015

(65) Prior Publication Data

US 2015/0205189 A1  Jul. 23, 2015

(30) Foreign Application Priority Data

Jan. 23, 2014 (JP) .................................. 2014-010159

(51) Int. Cl.
*G03B 21/20* (2006.01)
*H01L 33/50* (2010.01)

(52) U.S. Cl.
CPC ............ *G03B 21/204* (2013.01); *H01L 33/50* (2013.01); *H01L 33/501* (2013.01); *H01L 33/502* (2013.01); *G03B 21/2013* (2013.01); *G03B 21/2033* (2013.01); *G03B 21/2066* (2013.01)

(58) Field of Classification Search
CPC ... G03B 21/204; H01L 33/50; H01L 33/501; H01L 33/502
See application file for complete search history.

(56) References Cited

U.S. PATENT DOCUMENTS

| 8,337,027 | B2* | 12/2012 | Ogura | G03B 21/204 353/31 |
| 9,075,293 | B2* | 7/2015 | Zhang | F21V 9/00 |
| 2007/0075629 | A1* | 4/2007 | Le Toquin | C09K 11/0883 313/503 |
| 2011/0051102 | A1* | 3/2011 | Ogura | G03B 21/204 353/85 |
| 2011/0149549 | A1* | 6/2011 | Miyake | F21K 9/56 362/84 |
| 2012/0020073 | A1* | 1/2012 | Weichmann | H01S 3/16 362/231 |
| 2012/0162614 | A1* | 6/2012 | Kobayashi | H04N 9/3164 353/31 |
| 2012/0201030 | A1* | 8/2012 | Yuan | G02B 26/008 362/293 |
| 2013/0069007 | A1* | 3/2013 | Miyagawa | C09K 11/7721 252/301.6 R |
| 2013/0194551 | A1* | 8/2013 | Zhang | F21V 9/00 353/31 |
| 2013/0286359 | A1* | 10/2013 | Motoya | G03B 21/204 353/31 |
| 2014/0246692 | A1* | 9/2014 | Cui | C09K 11/7734 257/98 |
| 2014/0254133 | A1* | 9/2014 | Kotter | C09K 11/02 362/84 |
| 2015/0041712 | A1* | 2/2015 | Winkler | C04B 35/195 252/301.5 |
| 2015/0316233 | A1* | 11/2015 | Kawamata | F21V 7/22 362/317 |

FOREIGN PATENT DOCUMENTS

JP 2011-053320 A 3/2011

* cited by examiner

*Primary Examiner* — Bao-Luan Le
(74) *Attorney, Agent, or Firm* — Oliff PLC

(57) ABSTRACT

A fluorescent light emitting element includes a substrate; a phosphor layer that is provided on the substrate; an adhesive layer that is provided between the substrate and the phosphor layer; and a reflection unit that is provided between the adhesive layer and the substrate or between the adhesive layer and the phosphor layer. The phosphor layer is formed of a sintered body made of a cerium-activated garnet structure phosphor containing 0.05 atm % cerium, and a thickness of the phosphor layer is in a range of 100 μm to 250 μm.

14 Claims, 6 Drawing Sheets

FLUORESCENT LIGHT EMITTING ELEMENT AND PROJECTOR

BACKGROUND

1. Technical Field

The present invention relates to a fluorescent light emitting element and a projector including the fluorescent light emitting element.

2. Related Art

In the related art, a projector that modulates light emitted from a light source according to image information and projects the light is known. In the related art, a discharge type light source is used as the light source for such a projector. However, in recent years, a light emitting element such as a light emitting diode (LED) or a semiconductor laser is used in many cases. Further, a fluorescent light emitting element that converts a wavelength of light such as semiconductor laser using a phosphor is also used.

JP-A-2011-53320 discloses a light source device that includes an excitation light source and a phosphor layer which emits fluorescence using excitation light emitted from the excitation light source, in which the phosphor layer is formed of phosphors and a binder in which the phosphors are uniformly inlaid.

However, in the light source device disclosed in JP-A-2011-53320, since the binder as a base material is a resin such as silicone, the heat resistance of the phosphor layer becomes large. For this reason, there is a problem in that the temperature of the phosphor is increased in response to an increase in the light amount of the excitation light which is incident on the phosphor layer and the increased temperature causes temperature quenching of the phosphor. Further, in a case where the thickness of the phosphor layer is made extremely thin for a purpose of lowering the heat resistance of the phosphor layer, there is a problem in that excitation light absorptivity (absorbed amount of excitation light) of the phosphor layer is insufficient, fluorescence conversion efficiency of the excitation light is not improved, and thus, an improvement in output of the light source device may not be expected.

In addition, there is a correlation between concentration of a fluorescent substance (in a case of a YAG:Ce phosphor, $Ce^{3+}$ ion) in the inside of the phosphor and fluorescence quantum efficiency (the number of photons generated as fluorescence/the number of photons of excitation light absorbed in fluorescent substance) of the phosphor, and a phenomenon (concentration quenching) in which fluorescence quantum efficiency is decreased as the concentration of a fluorescent substance is increased is known in general.

In a phosphor layer obtained by mixing a binder and a phosphor in the related art, in a case where the thickness of the phosphor layer is made thin for a purpose of lowering the heat resistance, it is necessary to increase the concentration of a fluorescent substance so that excitation light absorptivity is not decreased. However, as described above, there is a problem in that the fluorescence quantum efficiency is decreased when the concentration of the fluorescent substance is increased and sufficient light emitting efficiency may not be obtained.

As a method of resolving the above-described problems, a method of arranging a sintered body, which is formed of only a phosphor without a binder, on a reflection mirror as it is exemplified. According to the method, heat resistance of a phosphor layer can be reduced using high thermal conductivity of the phosphor. Further, since the total amount of a necessary fluorescent substance can be secured even when the concentration of the fluorescent substance is not increased, necessary excitation light absorptivity can be secured. However, an optimal combination of the concentration of a fluorescent substance and the thickness of a phosphor layer, which can obtain sufficiently high light emitting efficiency, has not been disclosed.

Accordingly, a fluorescent light emitting element capable of obtaining high output by maximizing light emitting efficiency using an optimal combination of the concentration of a fluorescent substance and the thickness of a phosphor layer; and a projector including such a fluorescent light emitting element have been demanded.

SUMMARY

An advantage of some aspects of the invention is to solve at least a part of the problems described above, and the invention can be implemented as the following aspects or application examples.

Application Example 1

A fluorescent light emitting element according to this application example includes a substrate; a phosphor layer that is provided on the substrate; an adhesive layer that is provided between the substrate and the phosphor layer; and a reflection unit that is provided between the adhesive layer and the substrate or between the adhesive layer and the phosphor layer, in which the phosphor layer is formed of a sintered body made of a cerium-activated garnet structure phosphor containing 0.05 atm % cerium, and a thickness of the phosphor layer is in a range of 100 μm to 250 μm.

According to the fluorescent light emitting element, since the thermal resistance of the phosphor layer can be reduced using high thermal conductivity of the phosphor, it is possible to prevent generation of temperature quenching. Further, since the concentration of the fluorescent substance can be suppressed to be low, it is possible to prevent generation of concentration quenching. In this manner, necessary excitation light absorptivity can be secured by securing the total amount of the necessary fluorescent substance while thermal resistance of the phosphor layer is reduced, and thus, sufficiently high light emitting efficiency can be obtained.

Therefore, it is possible to realize a fluorescent light emitting element capable of obtaining high output by maximizing light emitting efficiency through realization of an optimal combination of the concentration of a fluorescent substance and the thickness of a phosphor layer.

Application Example 2

In the fluorescent light emitting element according to the application example described above, it is preferable that the reflection unit is formed of a reflective film that is provided between the adhesive layer and the substrate and the adhesive layer is formed of a resin through which fluorescence emitted from the phosphor layer passes.

According to the fluorescent light emitting element with this configuration, for example, the phosphor layer emits fluorescence by allowing excitation light to be incident on the phosphor layer from the upper direction (on the opposite side of the adhesive layer side) of the phosphor layer. Further, the phosphor layer (cerium as the fluorescent substance) isotropically emits fluorescence, and some of the emitted fluorescence is emitted to the incident direction (upper direction) of the excitation light. Further, the fluorescence emitted to the lower direction is reflected on the reflective film by passing through the adhesive layer. In addition, the fluorescence reflected on the reflective film can be emitted to the outside (mainly, the upper direction) by passing through the adhesive layer again and travelling into the phosphor layer.

Moreover, since the adhesive layer is formed of a resin, it is possible to allow a difference in thermal expansion coefficient between the phosphor layer and the reflective film (substrate) and to maintain bonding strength with respect to a change in temperature.

Application Example 3

In the fluorescent light emitting element according to the application example, it is preferable that the reflection unit is formed of a reflective film that is provided between the adhesive layer and the phosphor layer and the adhesive layer includes a base material made of a resin and a plurality of particles which are dispersed to the base material and whose thermal conductivity is higher than the thermal conductivity of the base material.

According to the fluorescent light emitting element with this configuration, for example, the phosphor layer emits fluorescence by allowing excitation light to be incident from the upper direction of the phosphor layer in the phosphor layer. Some of the emitted fluorescence is emitted to the incident direction (upper direction) of the excitation light. Further, the fluorescence emitted to the lower direction is reflected on the reflective film. In addition, the fluorescence reflected on the reflective film can be emitted to the outside (mainly, the upper direction) by travelling into the phosphor layer.

Further, since the adhesive layer includes a base material made of a resin and a plurality of particles which are dispersed to the base material and whose thermal conductivity is higher than that of the base material, the adhesive layer can be set as an adhesive layer with high thermal conductivity compared to an adhesive layer made of only a resin. Accordingly, the heat generated in the phosphor layer can be efficiently transmitted to the substrate through the adhesive layer. In this manner, the temperature of the phosphor layer can be efficiently cooled and generation of the temperature quenching of the phosphor layer can be more suppressed. Further, since the phosphor layer can be efficiently cooled, the phosphor layer can be irradiated with more excitation light. Therefore, it is possible to realize a fluorescent light emitting element capable of obtaining higher output. Moreover, since the adhesive layer is formed of a resin, it is possible to allow a difference in thermal expansion coefficient between the reflective film (phosphor layer) and the substrate and to maintain bonding strength with respect to a change in temperature.

Application Example 4

In the fluorescent light emitting element according to the application example described above, it is preferable that the reflection unit is formed of a reflective film that is provided between the adhesive layer and the phosphor layer and the adhesive layer be formed of solder.

According to the fluorescent light emitting element with this configuration, the thermal conductivity of the adhesive layer can be improved by forming the adhesive layer with solder when compared to an adhesive layer formed of a resin. In this manner, the temperature of the phosphor layer can be efficiently reduced and generation of the temperature quenching of the phosphor layer can be more suppressed. Further, since the phosphor layer can be efficiently cooled, the phosphor layer can be irradiated with more excitation light. Therefore, it is possible to realize a fluorescent light emitting element capable of obtaining higher output.

Application Example 5

In the fluorescent light emitting element according to the application example described above, it is preferable that the substrate is formed of aluminum, copper, an alloy containing aluminum as a main component, a composite material containing aluminum as a main component, an alloy containing copper as a main component, or a composite material containing copper as a main component.

According to the fluorescent light emitting element with this configuration, it is possible to improve the thermal conductivity of the substrate and to efficiently radiate the heat transmitted from the phosphor layer through the substrate. In this manner, the heat resistance of the entire fluorescent light emitting element can be efficiently reduced, and thus, a fluorescent light emitting element capable of obtaining high output can be realized by improving light emitting efficiency.

Application Example 6

In the fluorescent light emitting element according to the application example described above, it is preferable that the reflective film contains silver or an alloy of silver.

According to the fluorescent light emitting element with this configuration, it is possible to obtain high reflectance with respect to all directions in which fluorescence is incident and to effectively use the emitted fluorescence. Therefore, it is possible to realize a fluorescent light emitting element capable of obtaining high output by improving light emitting efficiency.

Application Example 7

In the fluorescent light emitting element according to the application example described above, it is preferable that the substrate is rotatable around a predetermined axis.

According to the fluorescent light emitting element with this configuration, it is possible to improve the heat radiating property of the substrate. In this manner, the heat resistance of the entire fluorescent light emitting element can be efficiently reduced, and thus, a fluorescent light emitting element capable of obtaining high output can be realized by improving light emitting efficiency.

Application Example 8

A projector according to this application example includes: an illuminating device that emits illumination light; a light modulating device that modulates the illumination light according to image information and forms image light; and a projection optical system that projects the image light, in which the fluorescent light emitting element according to any one of the application examples described above is used as the illumination device.

According to the projector, it is possible to improve brightness of a fluorescent light emitting element compared to a fluorescent light emitting element in the related art by means of using a fluorescent light emitting element capable of obtaining high output by maximizing light emitting efficiency as an illuminating device. Therefore, it is possible to improve brightness (luminance) of a projected image.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments will be described with reference to the accompanying drawings.

First Embodiment

Figure 1:
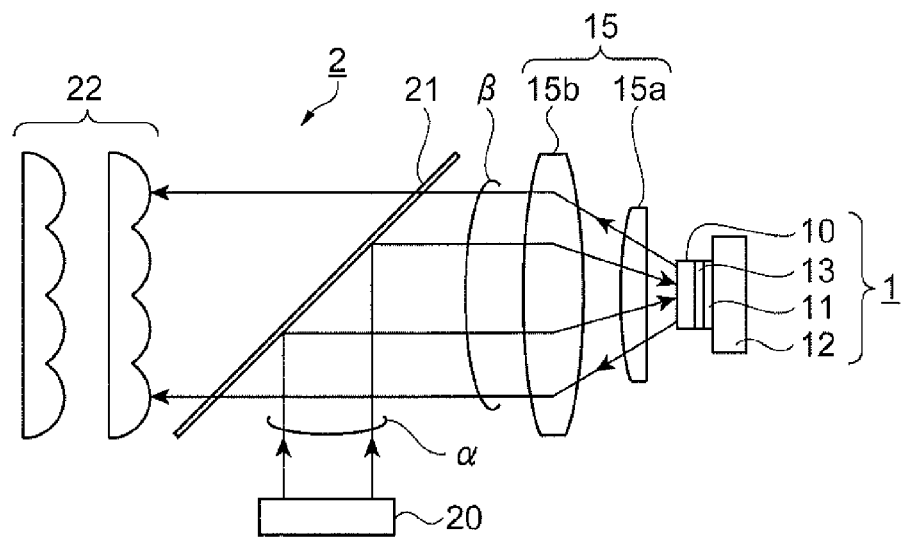
FIG. 1 is a view schematically illustrating an illuminating device using a fluorescent light emitting element according to a first embodiment.

FIG. 1 is a view schematically illustrating an illuminating device 2 using a fluorescent light emitting element 1 according to a first embodiment. The configuration of the illuminating device 2 (fluorescent light emitting element 1) will be described with reference to FIG. 1.

Further, for convenience of the description, in order for the size of each member to be made recognizable, dimensions are differentiated from the actual dimensions and each member is appropriately enlarged or reduced for illustration in the following drawings including FIG. 1.

As illustrated in FIG. 1, the fluorescent light emitting element 1 includes a phosphor layer 10, a reflective film 11 constituting a reflection unit, a substrate 12, and an adhesive layer 13. Further, the illuminating device 2 includes a collimate optical system 15, an excitation light source 20, a dichroic mirror 21, and a lens array 22 in addition to the fluorescent light emitting element 1.

The phosphor layer 10 emits fluorescence β when the phosphor layer 10 is irradiated with excitation light α. Further, the details of the phosphor layer 10 will be described below.

The excitation light source 20 irradiates the phosphor layer 10 with the excitation light a. In the present embodiment, a laser light source that emits blue light (a wavelength of approximately 445 nm) is used as the excitation light source 20. In addition, the excitation light source 20 maybe formed of one laser light source or multiple laser light source. Moreover, a light source that emits blue light having a wavelength other than a wavelength of 445 nm (for example, 460 nm or the like) as the blue light may be used as the laser light source.

The excitation light source 20 is configured so as to emit the excitation light α which is approximately parallel light. The dichroic mirror 21 reflects the excitation light α emitted from the excitation light source 20 by bending the excitation light to approximately 90 degrees and guides the excitation light to the phosphor layer 10.

According to the present embodiment, the collimate optical system 15 is an optical system which is formed of a first lens 15a and a second lens 15b, condenses the excitation light α of parallel light reflected on the dichroic mirror 21, and irradiates an upper surface 10a (see FIG. 2) of the phosphor layer 10 with the condensed light. Further, the collimate optical system 15 is an optical system making fluorescence emitted from the phosphor layer 10 into approximately parallel light. For this reason, the phosphor layer 10 is arranged on a focal position of the collimate optical system 15.

The lens array 22 divides fluorescence passing through the dichroic mirror 21 into plural divided light by a small lens group constituting the lens array 22. In addition, an illuminated region is illuminated with uniform illumination by superimposing the divided light onto each other in the illuminated region by a superimposed lens 24.

The excitation light α emitted from the excitation light source 20 is reflected on the dichroic mirror 21 and incident on the collimate optical system 15. The excitation light α is condensed by the collimate optical system 15 and applied to the phosphor layer 10. When the excitation light α is incident on the phosphor layer 10, the phosphor layer 10 generates fluorescence and emits the fluorescence. The emitted fluorescence β is made into approximately parallel light by the collimate optical system 15, passes through the dichroic mirror 21, and is incident on the lens array 22.

Figure 2:
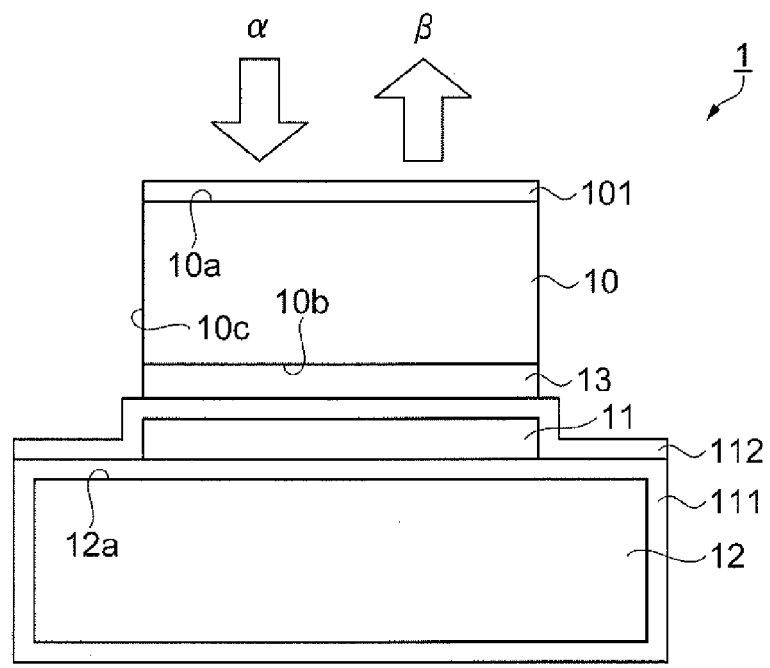
FIG. 2 is a cross-sectional view illustrating a configuration of the fluorescent light emitting element.

FIG. 2 is a cross-sectional view illustrating the configuration of the fluorescent light emitting element 1. The configuration of the fluorescent light emitting element 1 will be described with reference to FIG. 2.

As illustrated in FIG. 2, the fluorescent light emitting element 1 includes the phosphor layer 10, the reflective film 11 constituting the reflection unit, the substrate 12, and the adhesive layer 13.

The phosphor layer 10 is formed in a shape of an approximately square in a plan view. The phosphor layer 10 includes an upper surface 10a, a lower surface 10b, and a side surface 10c. Further, in the present embodiment, the upper surface 10a side of the phosphor layer 10 is set as an upper side and the lower surface 10b side of the phosphor layer 10 is set as a lower side.

The substrate 12 is a plate-like substrate formed in an approximately square shape in a plan view with an area which is the same as or larger than that of the phosphor layer 10. The reflection unit (reflective film 11) is formed on the upper surface of the substrate 12. In addition, the adhesive layer 13 bonding the phosphor layer 10 to the substrate 12 is formed on the upper surface of the reflective film 11. Accordingly, the reflective film 11 of the present embodiment is provided between the adhesive layer 13 and the substrate 12.

The phosphor layer 10 is formed of a sintered body made of a cerium-activated garnet structure phosphor containing 0.05 atm % cerium. Further, in the present embodiment, $Y_3Al_5O_{12}:Ce^{3+}$ is used as the cerium-activated garnet structure phosphor.

Further, in the present embodiment, the thickness of the phosphor layer 10 is approximately 170 μm. Moreover, the thickness of the phosphor layer 10 is preferably in the range of 100 μm to 250 μm. Moreover, the thickness of the phosphor layer 10 is more preferably in the range of 150 μm to 200 μm. The thickness of the phosphor layer 10 will be described below.

The substrate 12 is formed of a plate material of aluminum which is a metal member with high thermal conductivity. The reflective film 11 is formed on an upper surface 12a of the substrate 12. Specifically, the reflective film 11 is formed by containing Ag (silver) having high reflectance in all directions with respect to incident light.

Further, a film of aluminum oxide ($Al_2O_3$) is formed as a protective film 111 on all surfaces including the upper surface 12a of the substrate 12. The protective film 111 prevents oxidation of the substrate 12 and sulfurization of the reflective film 11. Further, a film of aluminum oxide ($Al_2O_3$) is formed on the upper surface of the reflective film 11 as a protective film 112 that prevents sulfurization of the reflective film 11 due to the environment even after the reflective film 11 is formed.

In the present embodiment, the adhesive layer 13 is made of a colorless transparent silicone resin. The adhesive layer 13 is applied to a space between the lower surface 10b of the phosphor layer 10 and the protective layer 112 formed on the upper surface of the reflective film 11 and bonds the phosphor layer 10 to the substrate 12.

In addition, an antireflection film 101 is formed on the upper surface 10a of the phosphor layer 10, prevents excitation light α (FIG. 1) emitted from the excitation light source 20 from being reflected on the upper surface 10a of the phosphor layer 10, and promotes the excitation light α to enter the inside of the phosphor layer 10.

Figure 3:
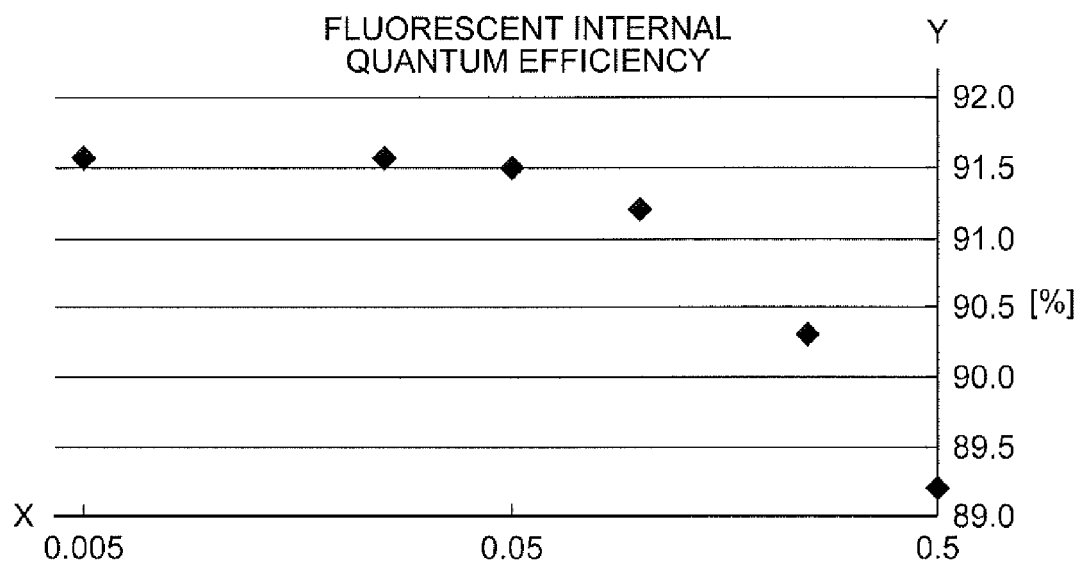
FIG. 3 is a diagram illustrating a correlation between the concentration and internal quantum efficiency.
Figure 4:
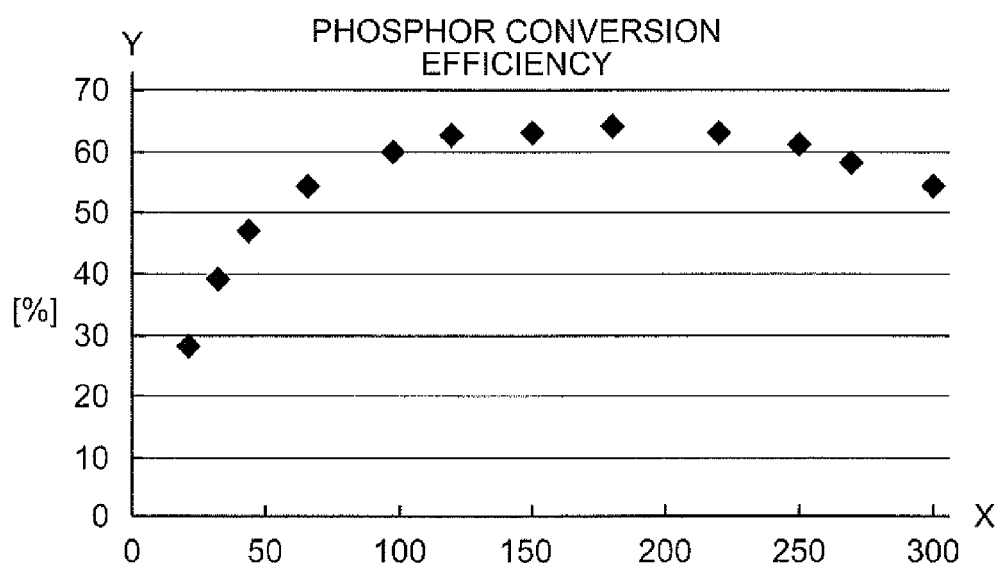
FIG. 4 is a diagram illustrating a correlation between the thickness and phosphor conversion efficiency.

FIG. 3 is a diagram illustrating a correlation between the concentration and the internal quantum efficiency. Further, FIG. 4 is a diagram illustrating a correlation between the thickness and the phosphor conversion efficiency. The correlation between the concentration and the internal quantum efficiency and the correlation between the thickness and the phosphor conversion efficiency in the present embodiment will be described with reference to FIGS. 3 and 4.

In FIG. 3, a horizontal axis X indicates the concentration (atm %) of cerium ($Y_3Al_5O_{12}:Ce^{3+}$) and a vertical axis Y indicates the internal quantum efficiency (%). Further, the internal quantum efficiency indicates a ratio of the number of photons generated in the inside of the phosphor layer as fluorescence with respect to the number of photons of excitation light absorbed to a fluorescent substance. FIG. 3 illustrates results of a change in internal quantum efficiency, in a case where the concentration of cerium is changed from 0.5 atm % to 0.005 atm %, which is acquired through a test performed by an inventor.

In general, in a case where the thickness of the phosphor layer is made thin for a purpose of lowering thermal resistance, it is necessary to secure necessary excitation light absorptivity (absorbed amount of excitation light) by increasing the concentration of cerium. However, it is known that the internal quantum efficiency is decreased (concentration quenching) when the concentration thereof is increased, and that sufficient light emitting efficiency may not be obtained. The results showing the above-described contents are illustrated in FIG. 3.

As a result of a test, as illustrated in FIG. 3, it is confirmed that when the concentration of cerium is 0.05 atm % or less, the internal quantum efficiency is approximately 91.5%, which is approximately constant (saturated). In contrast, it is confirmed that the internal quantum efficiency is decreased by increasing the concentration of cerium to more than 0.05 atm %.

FIG. 4, a horizontal axis X indicates the thickness (μm) of the phosphor layer 10 and a vertical axis Y indicates the phosphor conversion efficiency (%: fluorescence (Watt)/excitation light (Watt)). Further, FIG. 4 illustrates test results in a case where 50W of excitation light is input to a region of 1 mm² using the phosphor layer 10 of YAG:$Ce^{3+}$ (concentration of $Ce^{3+}$: 0.05 atm %). In this case, measurement is performed while the phosphor layer 10 is sufficiently cooled.

In general, the conversion efficiency of the phosphor depends on the excitation light absorptivity of the fluorescent substance. Since the excitation light absorptivity per unit area is constant in a uniform phosphor, the conversion efficiency of the phosphor is increased in a shape of a saturation curve when the thickness of the phosphor becomes larger. The results showing the above-described contents are illustrated in FIG. 4.

As a result of the test, as illustrated in FIG. 4, it is confirmed that the phosphor conversion efficiency is increased as the phosphor becomes thicker in the range of the thickness from the thinnest (in the present embodiment, 25 μm) to 100 μm in the phosphor whose concentration of $Ce^{3+}$ is 0.05 atm %. Further, it is confirmed that when the thickness thereof is in the range of 100 μm to 250 μm, the phosphor conversion efficiency is in the range of approximately 60% to 65%, which is approximately constant (saturated). Further, it is confirmed that the phosphor conversion efficiency is started to be decreased in a shape of a gradually falling curve in a case where the thickness thereof exceeds 250 μm. In addition, the factor of gradual falling is unclear, but it is considered that the reason is that the phosphor itself absorbs some fluorescence.

Accordingly, the thickness of the phosphor layer 10 whose concentration (concentration of $Ce^{3+}$) of the fluorescent substance is 0.05 atm % is preferably in the range of 100 μm to 250 μm. Further, the thickness thereof is more preferably in the range of 150 μm to 200 μm.

Here, returning to FIG. 2, an operation of the fluorescent light emitting element 1 will be described with reference to FIG. 2.

When the upper surface 10a of the phosphor layer 10 is irradiated with excitation light α from the upper direction of the phosphor layer 10, the phosphor layer 10 (cerium as a fluorescent substance) generates fluorescence from the excitation light α incident from the upper surface 10a. Further, cerium isotropically emits the fluorescence, and some of the emitted fluorescence is emitted from the upper surface 10a of the phosphor layer 10 to the incident direction (upper direction) of the excitation light α as fluorescence β. Moreover, the fluorescence emitted to the lower direction is emitted from the lower surface 10b of the phosphor layer 10, passes through the adhesive layer 13, and is reflected on the reflective film 11. In addition, the fluorescence reflected on the reflective film 11 passes through the adhesive layer 13 again, is incident on the phosphor layer 10, and travels the inside thereof, and is emitted from the upper surface 10a as the fluorescence β.

Further, in the phosphor layer 10, heat is generated by emitting light through application of excitation light α. However, the generated heat is transmitted to the substrate 12 made of aluminum whose thermal conductivity is higher than those of other metals through the adhesive layer 13 and the reflective film 11, and then radiated from the substrate 12.

Figure 5:
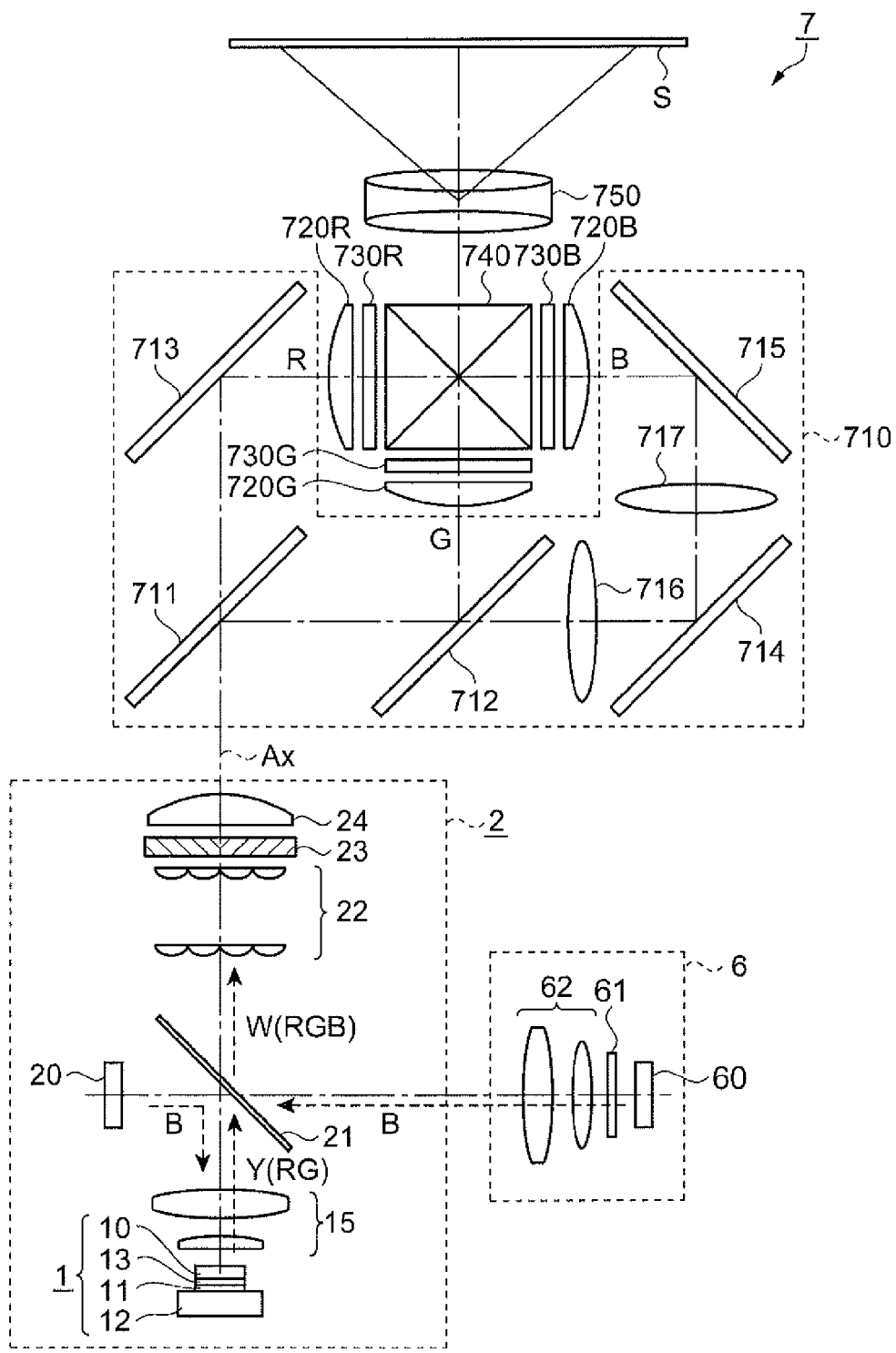
FIG. 5 is a view illustrating a configuration of an optical system of a projector using the illuminating device (fluorescent light emitting element).

FIG. 5 is a view illustrating a configuration of an optical system of a projector 7 using an illuminating device 2 (fluorescent light emitting element 1). The configuration of the optical system of the projector 7 will be described with reference to FIG. 5.

As illustrated in FIG. 5, the projector 7 includes an illuminating device 2, a second illuminating device 6, a color separation optical system 710, three liquid crystal panels 730R, 730G, and 730B as a light modulating device, a cross dichroic prism 740, and a projection optical system 750.

The illuminating device 2 includes the above-described fluorescent light emitting element 1 (in the present embodiment, the phosphor layer 10, the reflection unit (the reflective film 11), the substrate 12, the adhesive layer 13, and the like), the collimate optical system 15, the excitation light source 20, the dichroic mirror 21, the lens array 22, a polarization conversion element 23, and the superimposed lens 24.

In the illuminating device 2, excitation light α (blue light (B)) to be emitted from the excitation light source 20 (lase light source) is reflected on the dichroic mirror 21, and the phosphor layer 10 is irradiated with the reflected light condensed by the collimate optical system 15. The phosphor layer 10 emits fluorescence β toward the collimate optical system 15 through application of the excitation light α. Further, the phosphor layer 10 emits yellow light (Y) including red light (R) and green light (G) as fluorescence. The collimate optical system 15 emits the fluorescence to the dichroic mirror 21 nearly in parallel.

The second illuminating device 6 is formed of a light source 60 (laser light source), a scattering plate 61, and a collimate optical system 62. The scattering plate 61 scatters blue light (B) to be applied from the light source 60 with a predetermined degree of scattering and converts the scattered blue light into blue light (B) having light distribution similar to the fluorescence from the fluorescent light emitting element 1. The collimate optical system 62 suppresses diffusion of light from the light source 60 and emits light to the dichroic mirror 21 nearly in parallel.

The dichroic mirror 21 functions as a color synthesizing element that synthesizes light (blue light (B)) from the second illuminating device 6 and light (yellow light (Y)) from the fluorescent light emitting element 1. The dichroic mirror 21 emits white light (W (RGB)) in which respective colors are synthesized to the lens array 22 by reflecting the light (blue light (B)) from the second illuminating device 6 by bending the light to approximately 90 degrees and allowing the light (yellow light (Y)) from the fluorescent light emitting element 1 to pass therethrough.

The lens array 22 divides incident light into plural divided light and emits the divided light to the polarization conversion element 23.

The polarization conversion element 23 converts polarization directions of respective plural divided light which is divided by the lens array 22 into a predetermined direction and emits the light as linearly polarized light whose polarization direction is aligned.

The superimposed lens 24 condenses respective divided light from the polarization conversion element 23 to be superimposed on an image forming region (illuminated region) formed of the light crystal panels 730R, 730G, and 730B. The lens array 22 and the superimposed lens 24 constitute an integrator optical system which makes illumination distribution in the illuminated region uniform.

The color separation optical system 710 includes dichroic mirrors 711 and 712, reflection mirrors 713, 714, and 715, and relay lenses 716 and 717. The color separation optical system 710 separates light from the illuminating device 2 into red light, green light, and blue light, and guides each colored light of red light, green light, and blue light to the liquid crystal panels 730R, 730G, and 730B to be illuminated. Condensing lenses 720R, 720G, and 720S are arranged among the color separation optical system 710 and the liquid crystal panels 730R, 730G, and 730B.

A wavelength selecting permeation film that reflects light in a predetermined wavelength region on the substrate and allows light in other wavelength regions to pass therethrough is formed on the dichroic mirrors 711 and 712. The dichroic mirror 711 allows a red light component to pass therethrough and reflects a green light component and a blue light component. The dichroic mirror 712 reflects the green light component and allows the blue light component to pass therethrough. The reflection mirror 713 reflects the red light component. The reflection mirrors 714 and 715 reflect the blue light component.

Red light passing through the dichroic mirror 711 is reflected on the reflection mirror 713, passes through the condensing lens 720R, and is incident on the image forming region of the liquid crystal panel 730R for red light. Further, green light reflected on the dichroic mirror 711 is further reflected on the dichroic mirror 712, passes through the condensing lens 720G, and is incident on the image forming region of the liquid crystal panel 730G for green light. Blue light passing through the dichroic mirror 712 is incident on the image forming region of the liquid crystal panel 730B for blue light through the relay lens 716, the reflection mirror 714 on the incidence side, the relay lens 717, the reflection mirror 715 on the emission side, and the condensing lens 720B. The relay lenses 716 and 717, and the reflection mirrors 714 and 715 guide the blue light component passing through the dichroic mirror 712 to the liquid crystal panel 730B.

Moreover, the reason why the relay lenses 716 and 717 are provided on an optical path of blue light is to prevent a decrease in utilization efficiency of light due to divergence of light because the length of the optical path of blue light is longer than those of optical paths of other light. In the projector 7 of the present embodiment, a configuration in which the length of an optical path of red light is made longer in place of blue light and the relay lenses 716 and 717, and the reflection mirrors 714 and 715 are used for the optical path of red light may be employed.

The liquid crystal panels 730R, 730G, and 730B form colored image light by modulating incident colored light according to image information and are illumination objects of the illuminating device 2. Further, although not illustrated, polarization plates on the incidence side are respectively arranged between the respective condensing lenses 720R, 720G, and 720B and the respective liquid crystal panels 730R, 730G, and 730B; and polarization plates on the emission side are respectively arranged between the respective liquid crystal panels 730R, 730G, and 730B and the cross dichroic prism 740. Light modulation of each incident colored light is performed using these polarization plates on the incidence side, the liquid crystal panels 730R, 730G, and 730B, and the polarization plates on the emission side.

Respective liquid crystal panels 730R, 730G, and 730B are permeation type panels tightly sealing liquid crystals which are electro-optical substances in a pair of transparent glass substrates. The panels include polysilicon TFT as a switching element and modulate the polarization direction of linearly polarized light which is incident from the polarization plate on the incidence side according to a provided image signal.

The cross dichroic prism 740 is an optical element that synthesizes optical images modulated for each colored light and emitted from the polarization plate on the emission side and forms colored image light. The cross dichroic prism 740 has an approximately square shape, in a plan view, obtained by attaching four right angle prisms to one another; and optical multilayer films are formed on interfaces having an approximately X shape obtained by attaching the right angle prisms. An optical multilayer film formed on one interface having an approximately X shape reflects red light and an optical multilayer film formed on another interface reflects blue light. The red light and the blue light are bent by these optical multilayer films and three colored light beams are synthesized by aligning green light in the travelling direction.

Colored image light emitted from the cross dichroic prism 740 is diffused and projected by the projection optical system 750 and forms a projected image (color image) on a screen S.

The second illuminating device 6 may have a configuration in which a condensing optical system is inserted between the light source 60 and the scattering plate 61 and blue light (B) from the light source 60 is condensed in the vicinity of the scattering plate 61.

The following effects can be obtained according to the fluorescent light emitting element 1 and the projector 7 using the fluorescent light emitting element 1 of the present embodiment.

In the fluorescent light emitting element 1 of the present embodiment, the phosphor layer 10 is formed of a sintered body made of a cerium-activated garnet structure phosphor containing 0.05 atm % cerium and the thickness of the phosphor layer 10 is in the range of 100 µm to 250 µm. In this manner, since the thermal resistance of the phosphor layer 10 can be reduced using high thermal conductivity of the phosphor, it is possible to prevent generation of temperature quenching. Further, since the concentration of the fluorescent substance (cerium) can be suppressed to be low, it is possible to prevent generation of concentration quenching. In this manner, necessary excitation light absorptivity can be secured by securing the total amount of the necessary fluorescent substance while thermal resistance of the phosphor layer 10 is reduced. Therefore, sufficiently high light emitting efficiency can be obtained.

Therefore, it is possible to realize the fluorescent light emitting element 1 capable of obtaining high output by maximizing light emitting efficiency through realization of an optimal combination of the concentration of a fluorescent substance and the thickness of the phosphor layer 10.

In the fluorescent light emitting element 1 of the present embodiment, the reflection unit is formed of the reflective film 11 provided between the adhesive layer 13 and the substrate 12; and the adhesive layer 13 is formed of a colorless transparent silicone resin. In this manner, fluorescence emitted from the lower surface 10b of the phosphor layer 10 and fluorescence reflected on the reflective film 11 can pass through the adhesive layer 13. Further, since the adhesive layer 13 is made of a silicone resin, it is possible to allow a difference in thermal expansion coefficient between the phosphor layer 10 and the reflective film 11 (substrate 12) and to maintain the bonding strength with respect to a change in temperature.

According to the fluorescent light emitting element 1 of the present embodiment, when the substrate 12 is made of aluminum, the thermal conductivity of the substrate 12 can be improved compared to a case where the substrate 12 is made of another metal and heat transmitted from the phosphor layer 10 can be efficiently radiated through the substrate 12. In this manner, the heat resistance of the entire fluorescent light emitting element 1 can be efficiently reduced, and thus, the fluorescent light emitting element 1 capable of obtaining high output can be realized by improving light emitting efficiency.

According to the fluorescent light emitting element 1 of the present embodiment, when the reflective film 11 contains Ag (silver), it is possible to obtain high reflectance with respect to all directions in which fluorescence is incident and to effectively use the emitted fluorescence. Therefore, the fluorescent light emitting element 1 capable of obtaining high output can be realized by improving light emitting efficiency.

According to the projector 7 of the present embodiment, it is possible to improve brightness of the fluorescent light emitting element 1 compared to a fluorescent light emitting element in the related art by means of using the fluorescent light emitting element 1 capable of obtaining high output by maximizing light emitting efficiency as the illuminating device 2. Therefore, it is possible to improve brightness (luminance) of a projected image.

Further, since the amount of light having the same brightness as that in the related art can be obtained even when the amount of excitation light α applied to the phosphor layer 10 is reduced, it is possible to maintain the brightness of a projected image as that in the related art. Therefore, it is possible to attain energy savings by reducing power consumption.

Second Embodiment

Figure 6A:
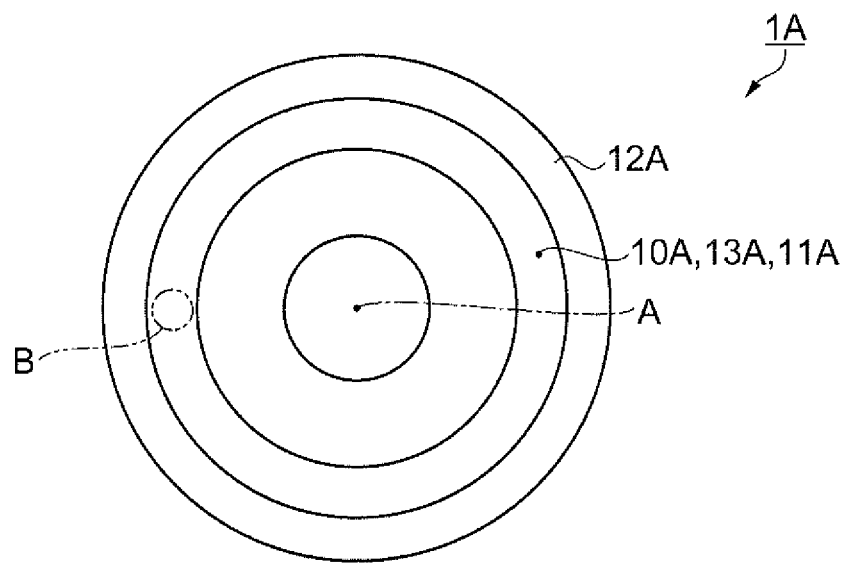
FIGS. 6A and 6B are views illustrating a configuration of a fluorescent light emitting element according to a second embodiment.
Figure 6B:
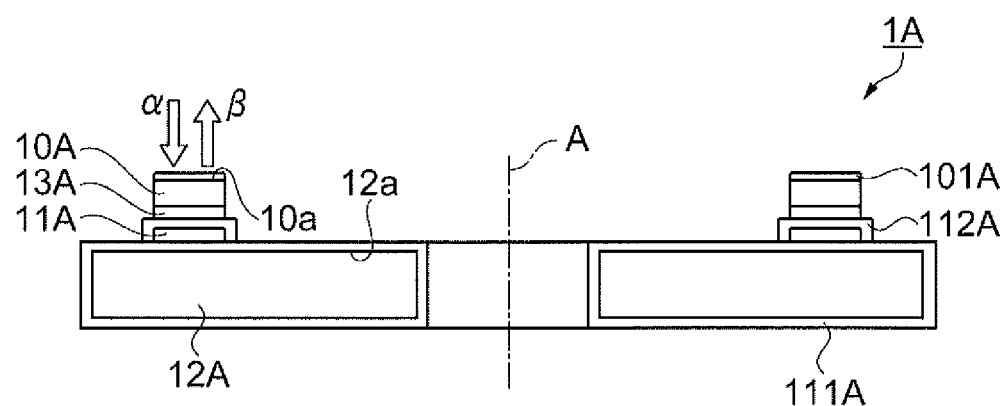

FIGS. 6A and 6B are views illustrating a configuration of a fluorescent light emitting element 1A according to a second embodiment. FIG. 6A is a plan view illustrating the fluorescent light emitting element 1A and FIG. 6B is a cross-sectional view illustrating the fluorescent light emitting element 1A. The configuration and an operation of the fluorescent light emitting element 1A will be described with reference to FIGS. 6A and 6B.

As illustrated in FIGS. 6A and 6B, the fluorescent light emitting element 1A of the present embodiment is formed of a wheel substrate 12A as a substrate, a phosphor layer 10A, a reflective film 11A, and an adhesive layer 13A. The wheel substrate 12A is a plate-like substrate formed in an approximately circle shape in a plan view with a predetermined rotation axis A as the center and is rotatable around the rotation axis A.

The phosphor layer 10A is formed to be extended along the rotation direction of the wheel substrate 12A. Moreover, the reflective film 11A and the adhesive layer 13A are formed to be extended along the rotation direction of the wheel substrate 12A relative to the phosphor layer 10A.

As illustrated in FIG. 6B, the phosphor layer 10A, the reflective film 11A, and the adhesive layer 13A of the fluorescent light emitting element 1A have the same cross-sectional configurations as those of the fluorescent light emitting element 1 (the phosphor layer 10, the reflective film 11, and the adhesive layer 13) of the first embodiment. In addition, other constituent members have the same configurations as those of the first embodiment in the cross-sectional configurations.

As illustrated in FIGS. 6A and 6B, the wheel substrate 12A is formed in a disk shape with the rotation axis A as the center. The phosphor layer 10A is formed on the upper surface 12a of the wheel substrate 12A in a circular shape (donut shape) with the rotation axis A as the center. Further, the reflective film 11A and the adhesive layer 13A; and protective films 111A and 112A, and an antireflection film 101A are formed relative to the phosphor layer 10A.

Since all constituent members are formed of the same members (materials and substances) as those of the first embodiment and the operation of light emission of fluorescence β with respect to excitation light α is the same as that of the first embodiment, specific description will not be repeated.

As illustrated in FIG. 6A, the phosphor layer 10A of the present embodiment is irradiated with excitation light a from the upper direction after being condensed in a position of a region B. In the phosphor layer 10A, fluorescence p is emitted from the upper surface 10a of the phosphor layer 10A while the position with respect to the region B to which the excitation light α is applied is moved (rotated) by the wheel substrate 12A being rotated about the rotation axis A.

Figure 7:
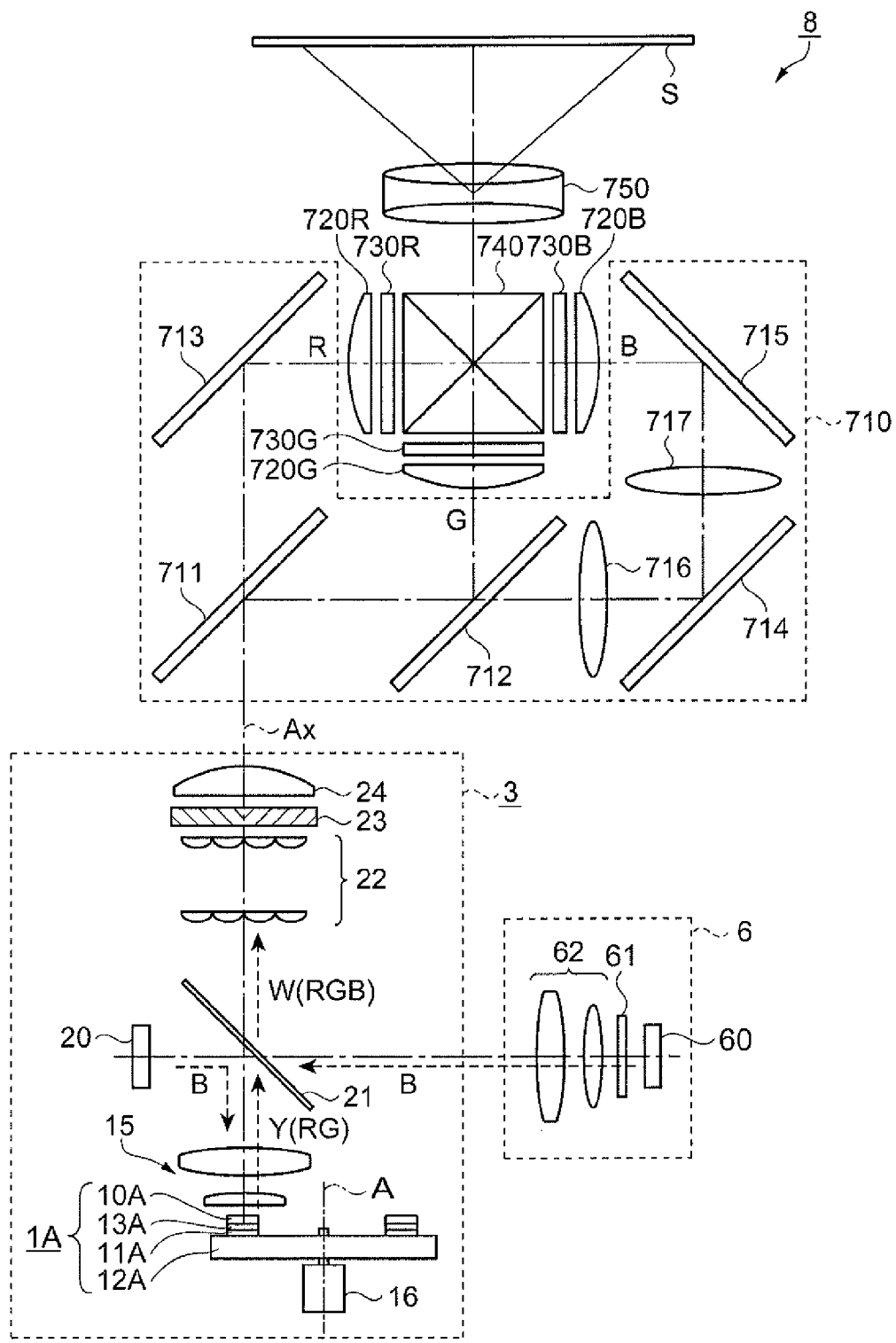
FIG. 7 is a view illustrating a configuration of an optical system of a projector using the illuminating device (fluorescent light emitting element).

FIG. 7 is a view illustrating a configuration of an optical system of a projector 8 using an illuminating device 3 (fluorescent light emitting element 1A). The configuration of the optical system of the projector 8 will be described with reference to FIG. 7.

The projector 8 of the present embodiment has a different configuration of the illuminating device 3 including the fluorescent light emitting element 1A from that of the projector 7 of the first embodiment. Other configurations are the same as those of the projector 7 of the first embodiment. Accordingly, the same constituent members as those of the projector 7 of the first embodiment are denoted by the same reference numerals as those of the first embodiment and the description thereof will not be repeated.

As illustrated in FIG. 7, the projector 8 of the present embodiment includes the illuminating device 3, a second illuminating device 6, a color separation optical system 710, three liquid crystal panels 730R, 730G, and 730B as a light modulating device, a cross dichroic prism 740, and a projection optical system 750.

The illuminating device 3 includes the above-described fluorescent light emitting element 1A (in the present embodiment, the phosphor layer 10A, the reflective film 11A, the wheel substrate 12A, the adhesive layer 13A, and the like), a collimate optical system 15, a motor 16, an excitation light source 20, a dichroic mirror 21, a lens array 22, a polarization conversion element 23, and a superimposed lens 24.

The illuminating device 3 reflects excitation light α (blue light (B)) applied from the excitation light source 20 (laser light source) on the dichroic mirror 21 and irradiates the phosphor layer 10A with the reflected light condensed by the collimate optical system 15.

Here, the wheel substrate 12A is rotatably formed by the motor 16 and rotates at a predetermined rotation speed about the rotation axis A. The phosphor layer 10A disposed on the upper surface 12a of the wheel substrate 12A rotates such that a position with respect to a condensing spot (a region B illustrated in FIG. 6A) of blue light (B) is moved at a predetermined speed due to the rotation of the wheel substrate 12A.

The phosphor layer 10A emits fluorescence β toward the collimate optical system 15 through application of incident excitation light α. Further, the phosphor layer 10A emits yellow light (Y) including red light (R) and green light (G) as fluorescence. The collimate optical system 15 emits the fluorescence β to the dichroic mirror 21 nearly in parallel.

The second illuminating device 6 is formed of a light source 60 (laser light source), a scattering plate 61, and a collimate optical system 62 in the same manner as those of the first embodiment. The scattering plate 61 scatters blue light (B) to be applied from the light source 60 with a predetermined degree of scattering and converts the scattered blue light into blue light (B) having light distribution similar to the fluorescence from the fluorescent light emitting element 1A. The collimate optical system 62 suppresses diffusion of light from the light source 60 and emits light to the dichroic mirror 21 nearly in parallel.

The dichroic mirror 21 functions as a color synthesizing element that synthesizes light (blue light (B)) from the second illuminating device 6 and light (yellow light (Y)) from the fluorescent light emitting element 1A. The dichroic mirror 21 emits white light (W (RGB)) in which respective colors are synthesized to the lens array 22 by reflecting the light (blue light (B)) from the second illuminating device 6 by bending the light to approximately 90 degrees and allowing the light (yellow light (Y)) from the fluorescent light emitting element 1A to pass therethrough.

Further, hereinafter, since the operations of the lens array 22, the polarization conversion element 23, and the superimposed lens 24 constituting the illuminating device 3 are the same as those of the illuminating device 2 of the optical system (FIG. 5) of the projector 7 of the first embodiment, the description thereof will not be repeated. Further, since the color separation optical system 710, three liquid crystal panels 730R, 730G, and 730B, the cross dichroic prism 740, and the projection optical system 750 which are formed subsequent to the illuminating device 3 have the same configurations as those of the optical system (FIG. 5) of the projector 7 of the first embodiment, the description thereof will not be repeated.

The second illuminating device 6 may have a configuration in which a condensing optical system is inserted between the light source 60 and the scattering plate 61 and blue light (B) from the light source 60 is condensed in the vicinity of the scattering plate 61.

According to the fluorescent light emitting element 1A and the projector 8 using the fluorescent light emitting element 1A, the following effects can be exhibited in addition to the same effects as those of the fluorescent light emitting element 1 and the projector 7 of the first embodiment.

In the fluorescent light emitting element 1A of the present embodiment, it is possible to prevent deformation due to rotation and deformation due to heat generated from the phosphor layer 10A by means of using a plate material of metal (aluminum) for the wheel substrate 12A. Further, the heat radiating property of the fluorescent light emitting element 1A can be improved by diffusing the generated heat into a wide range such that an area in contact with the air is increased. In this manner, the heat resistance of the entire fluorescent light emitting element 1A can be efficiently reduced, and thus, the fluorescent light emitting element IA capable of obtaining high output by improving light emitting efficiency can be realized.

According to the fluorescent light emitting element 1A of the present embodiment, since the phosphor layer 10A, the reflective film 11A, and the adhesive layer 13A are extended along the rotation direction of the wheel substrate 12A, the fluorescence β can be efficiently reflected to the incident direction (upper direction) of the excitation light α even when the wheel substrate 12A is allowed to rotate around the rotation axis A. The same effects as those of the fluorescent light emitting element 1 of the first embodiment can be exhibited.

According to the projector 8 of the present embodiment, it is possible to improve brightness of the fluorescent light emitting element 1A compared to a fluorescent light emitting element in the related art by means of using the fluorescent light emitting element 1A capable of obtaining high output by maximizing light emitting efficiency as the illuminating device 3. Therefore, it is possible to improve brightness (luminance) of a projected image.

Further, since the amount of light having the same brightness as that in the related art can be obtained even when the amount of excitation light α applied to the phosphor layer 10A is reduced, it is possible to maintain the brightness of a projected image as that in the related art. Therefore, it is possible to attain energy savings by reducing power consumption.

Third Embodiment

Figure 8:
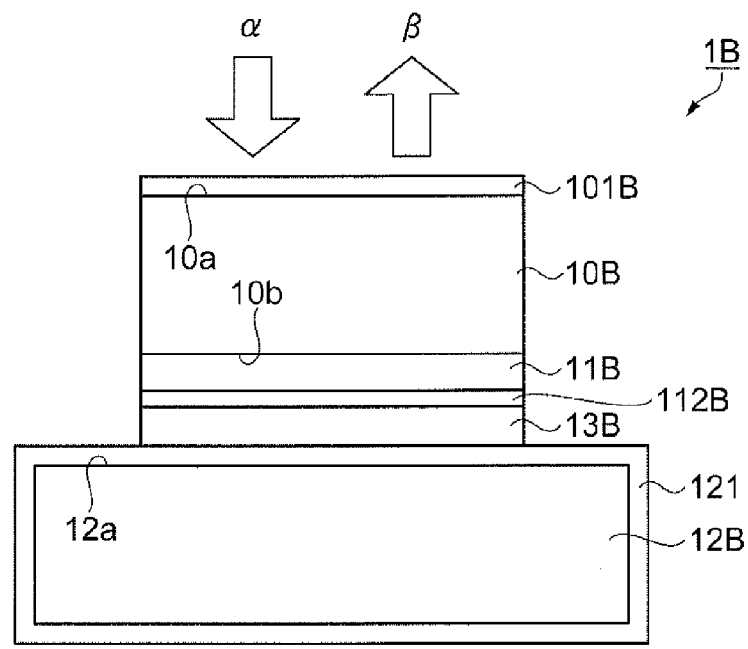
FIG. 8 is a cross-sectional view illustrating a configuration of a fluorescent light emitting element according to a third embodiment.

FIG. 8 is a cross-sectional view illustrating a configuration of a fluorescent light emitting element 1B according to a third embodiment. The configuration and an operation of the fluorescent light emitting element 1B will be described with reference to FIG. 8.

As illustrated in FIG. 8, the fluorescent light emitting element 1B of the present embodiment has a different position of a reflective film 11B from that of the fluorescent light emitting element 1 of the first embodiment. Further, accompanied by this, the position and the configuration of an adhesive layer 13B are different from those of the fluorescent light emitting element 1 of the first embodiment.

While the reflective film 11 (FIG. 2) of the first embodiment is provided between the adhesive layer 13 and the substrate 12, the reflective film 11B of the present embodiment is provided between the adhesive layer 13B and the phosphor layer 10B as illustrated in FIG. 8.

The phosphor layer 10B has the same configuration as that of the first embodiment. Specifically, the phosphor layer 10B is formed of a sintered body made of a cerium-activated garnet structure phosphor ($Y_3Al_5O_{12}$:$Ce^{3+}$) containing 0.05 atm % cerium and the thickness of the phosphor layer 10B is approximately 170 μm.

In the present embodiment, the reflective film 11B is formed on the lower surface 10b of the phosphor layer 10B. Further, the reflective film 11B is formed by containing Ag (silver) in the same manner as that of the reflective film 11 of the first embodiment. Moreover, a protective film 112B which protects the reflective film 11B from sulfurization due to the environment is formed on the lower surface of the reflective film 11B. Further, the protective film 112B is formed of a film of aluminum oxide ($Al_2O_3$) in the same manner as the protective film 112 of the first embodiment.

An antireflection film 101B is formed on the upper surface 10a of the phosphor layer 10B in the same manner as that of the antireflection film 101 of the first embodiment.

The substrate 12B is formed of a plate material of aluminum which is a metal member with high thermal conductivity in the same manner as the substrate 12 of the first embodiment. A film of aluminum oxide ($Al_2O_3$) is formed on all surfaces including the upper surface 12a of the substrate 12B as the protective film 121. Oxidation of the substrate 12B is prevented by the protective film 121.

The adhesive layer 13B is applied to a space between a protective film 112B protecting the reflective film 11B and a protective film 121 protecting the substrate 12B and bonds the phosphor layer 10B to the substrate 12B.

The adhesive layer 13B of the present embodiment includes a base material made of a resin, and a plurality of particles which are dispersed to the base material and whose thermal conductivity is higher than the thermal conductivity of the base material. Specifically, a silicone resin is used as the base material and metal particles are mixed into the silicone resin as the particles. In the present embodiment, particles of Ag (silver) with high thermal conductivity are used as the metal particles. Accordingly, the thermal conductivity of the adhesive layer 13B is more improved compared to the adhesive layer 13 (silicone resin) of the first embodiment. However, the adhesive layer 13B is not colorless and transparent.

An operation of the fluorescent light emitting element 1B will be described.

When the upper surface 10a of the phosphor layer 10B is irradiated with excitation light α from the upper direction of the phosphor layer 10B, the phosphor layer 10B (cerium as a fluorescent substance) generates fluorescence from the excitation light α incident from the upper surface 10a. Further, cerium isotropically emits the fluorescence, and some of the emitted fluorescence is emitted from the upper surface 10a of the phosphor layer 10B to the incident direction (upper direction) of the excitation light α as fluorescence β. Moreover, the fluorescence emitted to the lower direction is emitted from the lower surface 10b of the phosphor layer 10B and is reflected on the reflective film 11B. In addition, the fluorescence reflected on the reflective film 11B is incident on the phosphor layer 10B again, travels the inside thereof, and is emitted from the upper surface 10a as the fluorescence β. The adhesive layer 13B is not colorless and transparent. Therefore, in order for the light emitted from the lower surface 10b of the phosphor layer 10B to efficiently return to the phosphor layer 10B, it is preferable that the reflective film 11B be provided between the adhesive layer 13B and the phosphor layer 10B.

Further, heat is generated from the phosphor layer 10B by emitting light through application of excitation light α. However, the generated heat is transmitted to the substrate 12B through the reflective film 11B and the adhesive layer 13B, and then radiated from the substrate 12B. In the present embodiment, since metal particles (silver) are mixed into the adhesive layer 13B as a filler, the thermal conductivity is more improved compared to that of the adhesive layer (for example, the adhesive layer 13) made of only a silicone resin. Further, the substrate 12B is formed of aluminum with high thermal conductivity compared to those of other metals. In this manner, it is possible to efficiently radiate heat from the substrate 12B by efficiently transmitting heat generated from the phosphor layer 10B to the substrate 12B.

Moreover, the configuration of the fluorescent light emitting element 1B of the present embodiment can be applied to the projector 7 of the first embodiment by replacing the fluorescent light emitting element 1B with the fluorescent light emitting element 1 of the first embodiment.

Further, the configuration of the fluorescent light emitting element 1B of the present embodiment can be applied to the projector 8 of the second embodiment by forming the fluorescent light emitting element 1B in a wheel shape in the same manner as that of the fluorescent light emitting element 1A of the second embodiment.

According to the fluorescent light emitting element 1B of the present embodiment, the following effects can be exhibited in addition to the same effects as those of the fluorescent light emitting element 1 of the first embodiment.

Further, in the fluorescent light emitting element 1B of the present embodiment, since the adhesive layer 13B includes a base material made of a silicone resin and a plurality of particles (metal particles: Ag (silver) particles) which are dispersed to the base material and whose thermal conductivity is higher than that of the base material, the adhesive layer 13B can be set as an adhesive layer with high thermal conductivity. Accordingly, the heat generated in the phosphor layer 10B can be efficiently transmitted to the substrate 12B through the adhesive layer 13B. In this manner, the temperature of the phosphor layer 10B can be efficiently cooled and generation of the temperature quenching of the phosphor layer 10B can be more suppressed. Further, since the phosphor layer 10B can be efficiently cooled, the amount of excitation light α applied to the phosphor layer 10B can be increased. Therefore, it is possible to realize the fluorescent light emitting element 1B capable of obtaining higher output. Moreover, since the adhesive layer 13B is formed of a silicone resin as the base material, it is possible to allow a difference in thermal expansion coefficient between the reflective film 11B (phosphor layer 10B) and the substrate 12B and to maintain bonding strength with respect to a change in temperature.

Fourth Embodiment

Figure 9:
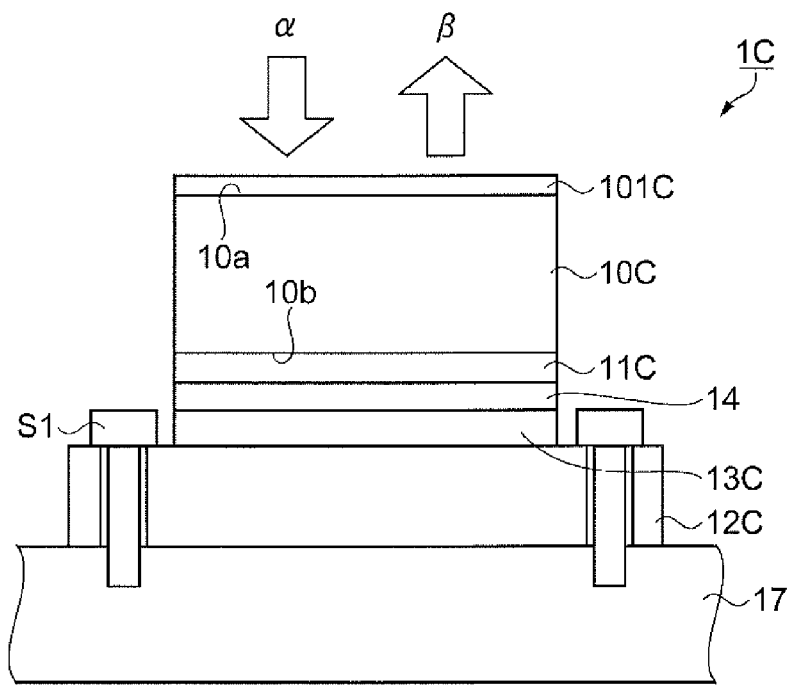
FIG. 9 is a cross-sectional view illustrating a configuration of a fluorescent light emitting element according to a fourth embodiment.

FIG. 9 is a cross-sectional view illustrating a configuration of a fluorescent light emitting element 1C according to a fourth embodiment. The configuration and an operation of the fluorescent light emitting element 1C will be described with reference to FIG. 9.

As illustrated in FIG. 9, the fluorescent light emitting element 1C of the present embodiment has a different position of a reflective film 11C from that of the fluorescent light emitting element 1 of the first embodiment. Further, accompanied by this, the position and the configuration of an adhesive layer 13C are different from those of the fluorescent light emitting element 1 of the first embodiment. Further, the configuration of the substrate 12C and the presence of a heat sink 17 connected to the substrate 12C are different from those of the fluorescent light emitting element 1 of the first embodiment.

While the reflective film 11 (FIG. 2) of the first embodiment is provided between the adhesive layer 13 and the substrate 12, the reflective film 11C of the present embodiment is provided between the adhesive layer 13C and the phosphor layer 10C as illustrated in FIG. 9.

The phosphor layer 10C has the same configuration as the phosphor layer 10 of the first embodiment. Specifically, the phosphor layer 10C is formed of a sintered body made of a cerium-activated garnet structure phosphor ($Y_3Al_5O_{12}$: $Ce^{3+}$) containing 0.05 atm % cerium and the thickness of the phosphor layer 10C is approximately 170 μm.

In the present embodiment, the reflective film 11C is formed on the lower surface 10b of the phosphor layer 10C. Further, the reflective film 11C is formed by containing Ag (silver) in the same manner as the reflective film 11 of the first embodiment. In addition, a plating layer 14 formed of Ni—Au (nickel-gold) plating is formed on the lower surface of the reflective film 11C.

An antireflection film 101C is formed on the upper surface 10a of the phosphor layer 10C in the same manner as that of the antireflection film 101 of the first embodiment.

The substrate 12C is formed of a plate material of copper which is a metal member with high thermal conductivity in the present embodiment.

The adhesive layer 13C is formed of Au—Sn (gold-tin) solder in the present embodiment. A space between the plating layer 14 and the substrate 12C is coated with the adhesive layer 13C and the phosphor layer 10C is bonded (soldered) to the substrate 12C.

Further, the substrate 12C to which the phosphor layer 10C is bonded is fixed to the heat sink 17 described below using a screw Si, and the substrate 12C of the present embodiment functions as a so-called heat spreader which increases the thermal conductivity by bringing the heat sink 17 into close contact with the substrate 12C and is provided for efficient cooling.

In the present embodiment, the heat sink 17 is formed of aluminum and connected to the substrate 12C. Specifically, the heat sink 17 includes a plurality of fins (not illustrated) and improves heat radiation performance by enlarging the surface area.

An operation of the fluorescent light emitting element 1C will be described.

When the upper surface 10a of the phosphor layer 10C is irradiated with excitation light α from the upper direction of the phosphor layer 10C, the phosphor layer 10C (cerium as a fluorescent substance) generates fluorescence from the excitation light α incident from the upper surface 10a. Further, cerium isotropically emits the fluorescence, and some of the emitted fluorescence is emitted from the upper surface 10a of the phosphor layer 10C to the incident direction (upper direction) of the excitation light α as fluorescence β. Moreover, the fluorescence emitted to the lower direction is emitted from the lower surface 10b of the phosphor layer 10C and is reflected on the reflective film 11C. In addition, the fluorescence reflected on the reflective film 11C is incident on the phosphor layer 10C again, travels the inside thereof, and is emitted from the upper surface 10a as the fluorescence β.

Further, heat is generated from the phosphor layer 10C by emitting light through application of excitation light α. However, the generated heat is transmitted to the adhesive layer 13C formed of Au—Sn solder through the reflective film 11C and the plating layer 14. Further, the heat transmitted to the adhesive layer 13C is transmitted to the substrate 12C functioning as a heat spreader. The heat transmitted to the substrate 12C is efficiently transmitted to the heat sink 17 through divergence and can be efficiently radiated from the heat sink 17.

Moreover, the configuration of the fluorescent light emitting element 1C of the present embodiment can be applied to the projector 7 of the first embodiment by replacing the fluorescent light emitting element 1C with the fluorescent light emitting element 1 of the first embodiment.

Further, the configuration of the fluorescent light emitting element 1C of the present embodiment can be applied to the projector 8 of the second embodiment by forming the fluorescent light emitting element 10, from which the heat sink 17 is removed, in a wheel shape in the same manner as that of the fluorescent light emitting element 1A of the second embodiment.

According to the fluorescent light emitting element 1C of the present embodiment, the following effects can be exhibited in addition to the same effects as those of the fluorescent light emitting element 1 of the first embodiment.

Further, in the fluorescent light emitting element 1C of the present embodiment, when the adhesive layer 13C is formed of solder (Au—Sn solder), the thermal conductivity of the adhesive layer 13C can be more improved than that of the adhesive layer 13C formed of a resin. In this manner, the temperature of the phosphor layer 10C can be efficiently cooled and generation of the temperature quenching of the phosphor layer 10C can be more suppressed. Further, since the phosphor layer 10C can be efficiently cooled, the amount of excitation light α applied to the phosphor layer 10C can be increased. Therefore, it is possible to realize the fluorescent light emitting element 1C capable of obtaining higher output.

In the fluorescent light emitting element 1C of the present embodiment, the heat transmitted to the substrate 12C can be efficiently radiated to the outside by the heat sink 17 by connecting the heat sink 17 to the substrate 12C using the substrate 12C as a heat spreader, and thus, generation of temperature quenching of the phosphor layer 10C can be prevented.

In addition, the invention is not limited to the above-described embodiments and can be realized by adding various modifications or improvements within the range not departing from the scope of the invention. Modification examples are described below.

The substrate 12 of the first embodiment is formed of aluminum. However, without limiting thereto, the substrate may be formed of a metal with excellent thermal conductivity such as copper. The same can be applied to the wheel substrate 12A of the second embodiment and the substrate 12B of the third embodiment.

In the projector 7 of the first embodiment and the projector 8 of the second embodiment, three liquid crystal panels 730R, 730G, and 730B are employed as a light modulation device. However, without limiting thereto, a liquid crystal panel which displays a color image by itself may be employed as a light modulation device.

In the projector 7 of the first embodiment and the projector 8 of the second embodiment, permeation type liquid crystal panels (light modulation device) are employed for three liquid crystal panels 730R, 730G, and 730B as a light modulation device. However, without limiting thereto, other light modulation devices having different systems such as a reflection type light modulation device and a micromirror type light modulation device can be employed. Further, as the micromirror type light modulation device, for example, a digital micromirror device (DMD, trademark of Texas Instruments Incorporated) can be employed.

The entire disclosure of Japanese Patent Application No. 2014-010159, filed on Jan. 23, 2014 is expressly incorporated by reference herein.

What is claimed is:

1. A fluorescent light emitting element, comprising:
a substrate;
a phosphor layer that is provided on the substrate;
an adhesive layer that is provided between the substrate and the phosphor layer; and
a reflection unit that is provided between the adhesive layer and the substrate or between the adhesive layer and the phosphor layer,
wherein the phosphor layer is formed of a sintered body made of a cerium-activated garnet structure phosphor containing 0.05 atm % cerium, and
a thickness of the phosphor layer is in a range of 100 μm to 250 μm.

2. The fluorescent light emitting element according to claim 1,
wherein the reflection unit is formed of a reflective film that is provided between the adhesive layer and the substrate, and
the adhesive layer is formed of a resin through which fluorescence emitted from the phosphor layer passes.

3. The fluorescent light emitting element according to claim 1,
wherein the reflection unit is formed of a reflective film that is provided between the adhesive layer and the phosphor layer, and
the adhesive layer includes a base material made of a resin, and a plurality of particles which are dispersed to the base material and whose thermal conductivity is higher than the thermal conductivity of the base material.

4. The fluorescent light emitting element according to claim 1,
wherein the reflection unit is formed of a reflective film that is provided between the adhesive layer and the phosphor layer, and
the adhesive layer is formed of solder.

5. The fluorescent light emitting element according to claim 1, wherein the substrate is formed of aluminum, copper, an alloy containing aluminum as a main component, a composite material containing aluminum as a main component, an alloy containing copper as a main component, or a composite material containing copper as a main component.

6. The fluorescent light emitting element according to claim 2, wherein the reflective film contains silver or an alloy of silver.

7. The fluorescent light emitting element according to claim 1, wherein the substrate is rotatable around a predetermined axis.

8. A projector comprising:
an illuminating device that emits illumination light;
a light modulating device that modulates the illumination light according to image information and forms image light; and
a projection optical system that projects the image light,
wherein the fluorescent light emitting element according to claim 1 is used as the illumination device.

9. A projector comprising:
an illuminating device that emits illumination light;
a light modulating device that modulates the illumination light according to image information and forms image light; and
a projection optical system that projects the image light,
wherein the fluorescent light emitting element according to claim 2 is used as the illumination device.

10. A projector comprising:
an illuminating device that emits illumination light;
a light modulating device that modulates the illumination light according to image information and forms image light; and
a projection optical system that projects the image light,
wherein the fluorescent light emitting element according to claim 3 is used as the illumination device.

11. A projector comprising:
an illuminating device that emits illumination light;
a light modulating device that modulates the illumination light according to image information and forms image light; and
a projection optical system that projects the image light,
wherein the fluorescent light emitting element according to claim 4 is used as the illumination device.

12. A projector comprising:
an illuminating device that emits illumination light;
a light modulating device that modulates the illumination light according to image information and forms image light; and
a projection optical system that projects the image light, wherein the fluorescent light emitting element according to claim 5 is used as the illumination device.

13. A projector comprising:

an illuminating device that emits illumination light;

a light modulating device that modulates the illumination light according to image information and forms image light; and a projection optical system that projects the image light, wherein the fluorescent light emitting element according to claim 6 is used as the illumination device.

14. A projector comprising:

an illuminating device that emits illumination light;

a light modulating device that modulates the illumination light according to image information and forms image light; and a projection optical system that projects the image light, wherein the fluorescent light emitting element according to claim 7 is used as the illumination device.

\* \* \* \* \*